United States Patent [19]

Pryor

[11] Patent Number: 5,236,545
[45] Date of Patent: Aug. 17, 1993

[54] METHOD FOR HETEROEPITAXIAL DIAMOND FILM DEVELOPMENT

[75] Inventor: Roger W. Pryor, Bloomfield Township, Bloomfield Hills County, Mich. 48013

[73] Assignee: The Board of Governors of Wayne State University, Detroit, Mich.

[21] Appl. No.: 956,391

[22] Filed: Oct. 5, 1992

[51] Int. Cl.$^5$ .............................................. C30B 25/06
[52] U.S. Cl. .................................. 156/613; 156/614; 156/DIG. 68; 156/DIG. 89; 156/DIG. 115; 423/446
[58] Field of Search ............... 156/613, 614, DIG. 68, 156/DIG. 89, DIG. 115; 423/446

[56] References Cited

U.S. PATENT DOCUMENTS

| | | | |
|---|---|---|---|
| 4,859,493 | 8/1989 | Lemelson | 427/45.1 |
| 4,869,924 | 9/1989 | Ito | 427/39 |
| 4,935,303 | 6/1990 | Ikoma et al. | 428/408 |
| 4,940,015 | 7/1990 | Kobashi et al. | 118/723 |
| 4,981,568 | 1/1991 | Taranko et al. | 204/192.3 |
| 4,981,818 | 1/1991 | Anthony et al. | 437/233 |
| 4,987,002 | 1/1991 | Sakamoto et al. | 427/34 |
| 4,997,636 | 3/1991 | Prins | 423/446 |
| 5,023,068 | 6/1991 | Jones | 156/DIG. 68 |
| 5,130,111 | 7/1992 | Pryor | 156/DIG. 68 |
| 5,174,983 | 12/1992 | Snail | 156/DIG. 68 |

FOREIGN PATENT DOCUMENTS 0439135 1/1991 European Pat. Off. .
0445754 9/1991 European Pat. Off. .

OTHER PUBLICATIONS

"Laser Deposited Cubic Boron Nitride Films", 191 Material Research Society Symposium 55, Doll, et al. (1990).
"On Epitaxial Growth of Diamond Films on (100) Silicon Substrates", 53 Applied Physics Letter 1823, Narayan and Srivatsa (1988).
"Epitaxial Growth of Diamond Thin Films on Cubic Boron Nitride (111) Surfaces by DC Plasma Chemical Vapor Deposition", 57 Applied Physics Letter 563, Koizumi, et al. (1990).
"Epitaxial Growth of Diamond Films on Si(111) at Room Temperature by Mass-Selected Low-Energy C+ Beams", 243 Science Reports 1047, Robertson, et al. (1989).

Primary Examiner—Robert Kunemund
Assistant Examiner—Felisa Garrett
Attorney, Agent, or Firm—Dykema Gossett

[57] ABSTRACT

A method for preparing heteroepitaxial diamond films on silicon substrates is described. This method first involves the deposition of a cubic boron nitride layer on the silicon substrate as a first interfacial layer using laser ablation with a hexagonal boron nitride target in the presence of a nitrogen-containing atmosphere. The boron nitride layer is followed with a second interfacial layer, generally about 1 to 10 monolayers thick, of hydrogen terminated carbon which is deposited with laser ablation with a carbon target in the presence of atomic hydrogen. Finally, the heteroepitaxial diamond film is deposited using conventional chemical vapor deposition (CVD) techniques with a reactive gas mixture containing hydrogen, a carbon-containing gas or gases, and, optionally, oxygen. Large area, high quality heteroepitaxial diamond films can be prepared by this method. Silicon with such a heteroepitaxial diamond film should be especially suited for the fabrication of high-speed, high-power semiconductor devices at reasonable cost.

29 Claims, 2 Drawing Sheets

METHOD FOR HETEROEPITAXIAL DIAMOND FILM DEVELOPMENT

The present invention is related to the production of heteroepitaxial diamond films. More specifically, the present invention is related to the production of heteroepitaxial diamond films on silicon substrates.

BACKGROUND OF THE INVENTION

Thin polycrystalline diamond films on various substrates and thin heteroepitaxial diamond films can be fabricated from carbon-bearing gases by various chemical vapor deposition (CVD) methods. Such CVD methods include the application of thermal, combustion, direct current plasmas, RF plasmas, and microwave initiated plasmas methods in both high and low pressure environments. The carbon-bearing gas is typically a mixture of hydrogen and methane (or other hydrocarbon). The hydrogen dissociates to form atomic hydrogen. The methane also dissociates, presumably forming methyl radicals ($.CH_3$) which are thought to be instrumental in promoting diamond growth. The diamond films produced by such methods generally have significantly lower diffusivity and mobility values than natural or synthetic single crystal diamonds.

Microwave plasma deposition of diamond has recently received considerable attention as a viable commercial system for producing polycrystalline diamond thin films. Typically, a frequency of about 2.45 GHz is utilized to dissociate a feedstock gas mixture containing hydrogen and a carbon source gas such as methane or acetylene. As noted above, the microwave radiation dissociates the feedstock gases to produce atomic hydrogen and an active carbon component (such as a methyl radical). Typically, the process is carried out at pressures in the rang of 1 to 100 torr by positioning the substrate on a heated support within the CVD chamber. Deposition normally occurs at temperature between about 500° and 1100° C. Polycrystalline diamond films with some non-diamond carbon (i.e., graphitic carbon) can be formed in this manner over a relatively large substrate area. The crystallites formed are generally in the range of about 25 nanometers to 25 microns. Polycrystalline diamond films have been successfully grown on a wide variety of substrates, including, for example, nickel, copper, titanium, ceramics, carbides, nitrides, sapphire, silicon, and graphite.

Homoepitaxial diamond films have also been grown using CVD techniques. As one skilled in the art realizes, such homoepitaxial diamond films are grown on single crystal diamond substrates. Attempts to prepare epitaxial diamond films on other substrates (i.e., heteroepitaxial diamond films) have generally been unsuccessful. At present, the only successfully and reproducibly grown heteroepitaxial diamond film have been on small, high pressure, synthetic cubic boron nitride single crystals. Both synthetic diamond single crystals and synthetic cubic boron nitride single crystals are relatively small when prepared by conventional high pressure processes. Although such single crystals are of high quality, they do not provide suitable substrates for preparing epitaxial diamond films for use, for example, as electronic devices in large volumes due to the excessive production costs of the crystals themselves and to their relatively small size.

Attempts to grow heteroepitaxial diamond films on silicon have generally been unsuccessful. Recently, Robertson et al., 243 *Science* 1047 (1989), reported the apparent growth of very thin (0.7 micrometers) diamond films on silicon (111) substrates. The evidence for the growth of such a heteroepitaxial diamond film was not, however, conclusive. The authors of that report noted that since "our diamond (111) film is formed on Si (111), we assume that it continues to grow epitaxially under the carbon fluence . . . . It is thererfore reasonable to assume that the transparent film reported herein is essentially a diamond mosaic crystal." 243 *Science* at 1049. The assumed heteroepitaxial diamond film was grown on Si (111) wafers at room temperature using mass-selected 120 electron volt $C^+$ ion beam deposition in an ultrahigh vacuum. If heteroepitaxial diamond growth did in fact occur, the mosaic block size or area of heteroepitaxial diamond growth was very small (about 150 Å). Epitaxial growth by such hyperthermal ions was thought to involve shallow implantation rather than the surface process typically occurring with CVD processes.

Narayan et al., 53 *Appl. Phys. Lett.* 1823 (1988), reported on a spectroscopic investigation of polycrystalline diamond thin films on silicon (100) substrates prepared using direct current plasma CVD techniques with hydrogen and methane mixtures. Both diamond and graphitic bonding were observed with the relative amount of diamond growth increasing with decreasing methane concentration. Grains (approximately 1 micron in diameter) containing epitaxial cubic diamond were observed within the film. The cubic diamond crystalline phase was aligned with the underlying silicon crystalline structure in a complex manner. Specifically, the <011> diamond crystals exhibited matching in the {111} or {200} lattice planes of diamond with the {022} plane of silicon. The misalignment of mismatching of crystalline planes was thought to be due to the mismatch of the lattice constants between diamond and silicon (lattice constants of 3.57 and 5.43 Å, respectively). This study illustrates the difficulty of the direct epitaxial planar diamond film growth on silicon substrates.

Another attempted approach to preparing heteroepitaxial diamond films is based on the growth of cubic boron nitride thin films on single crystal silicon. Doll et at., 191 *Mat. Res. Soc. Symp. Proc.* 55 (1990), reported the successful growth of cubic boron nitride thin films on single crystal silicon (100) using pulsed excimer laser ablation of a hexagonal boron nitride bulk target. As Doll et al. recognized, such a cubic boron nitride film on silicon would appear to be an attractive substrate for diamond growth due to the small mismatch in lattice constants. Cubic boron nitride has a lattice constant of 3.62 Å, which is closely matched with the 3.57 Å lattice constant of diamond. In addition, epitaxial diamond has been successfully grown on small, synthetic single crystals of cubic boron nitride. It was, therefore, reasonably believed that the preparation of heteroepitaxial diamond film on single crystal silicon using an intermediate layer of cubic boron nitride would be a simple and straightforward procedure. Unfortunately, attempts to prepare heteroepitaxial diamond films on silicon using an intermediate cubic boron nitride film prepared by the Doll let al. procedure have not been successful despite high expectations. When the cubic boron nitride film is exposed to the ionized carbon-bearing gas during attempted diamond deposition by CVD techniques, the boron nitride film is completely volatilized before the diamond film can nucleate and grow. Volatilization probably occurs by the reaction of the cubic boron nitride with the .CH₃ radicals formed during ionization. Nonetheless, the cubic boron nitride film is destroyed and heteroepitaxial diamond formation does not occur.

Problems with preparing heteroepitaxial diamond films on silicon aside, silicon should be the substrate material of choice for heteroepitaxial diamond films. Silicon (especially silicon in the form of wafers) has been used extensively in fabricating electronic devices. Diamond's physical properties, including hardness, wide band gap, and high thermal conductivity, suggest that heteroepitaxial diamond films on silicon should be especially attractive for electronic device applications. Indeed, the development of a method of preparing heteroepitaxial diamond films on silicon should allow for the fabrication of high-speed, high-power semiconductor devices at reasonable cost. Therefore, it is highly desirable that a reproducible method is developed whereby heteroepitaxial diamond films of adequate thickness, area, and quality can be grown on silicon substrates. The present invention provides a method of preparing such heteroepitaxial diamond films on silicon in a straightforward and reproducible manner. The present method also provides a method for preparing such heteroepitaxial diamond films on silicon wherein the diamond films are of adequate thickness, area, and quality as to be useful in the fabrication of high-speed, high-power semiconductor devices. The present invention also provides for silicon articles having heteroepitaxial diamond films thereon.

SUMMARY OF THE INVENTION

The present invention relates to a method of producing heteroepitaxial diamond films on silicon. The present invention also relates to silicon articles of manufacture having such heteroepitaxial diamond films thereon. The method of this invention uses a combination of laser ablation and microwave CVD techniques to prepare heteroepitaxial diamond films on silicon. This method uses two interfacial layers between the underlying silicon substrate and the desired heteroepitaxial diamond film. The first interfacial layer is an epitaxial cubic boron nitride layer formed directly on the silicon substrate. This first interfacial layer provides a lattice matching layer between the diamond and silicon layers. The second interfacial layer, which is applied on the surface of the cubic boron nitride layer, is an ultra-thin, laser ablated diamond precursor carbon layer which appears to passivate the cubic boron nitride surface and act as an epitaxial nucleation layer for subsequent diamond growth. The heteroepitaxial diamond layer can be grown directly on the second interfacial layer suing conventional microwave CVD techniques. By application of the second interfacial layer, the cubic boron nitride layer (the first interfacial layer) is protected sufficiently during the CVD deposition procedure to allow for the deposition of the heteroepitaxial diamond film. In other words, the second interfacial layer appears to prevent the volatilization of the cubic boron nitride layer in the presence of methyl radicals or other reactive species formed during the CVD process.

The present invention allows for the modification of a single crystal silicon surface sufficiently to facilitate the growth of a thin, high quality, large area, heteroepitaxial diamond film. The surface modification is carried out by using laser ablation techniques. A heteroepitaxial diamond film or layer can then be grown on the modified silicon surface with conventional CVD techniques. Applicant is not aware of any other method by which such heteroepitaxial diamond films can be grown on a silicon surface.

The present invention also allows for the manufacture of silicon articles having such heteroepitaxial diamond films. Silicon articles prepared by the process of this invention have, in order, silicon substrate material, a first interfacial layer of cubic boron nitride, a second interfacial layer of carbon, and a final layer of heteroepitaxial diamond. Such diamond coated silicon articles should be especially useful in preparing or fabricating high-speed, high-power semiconductor devices.

One object of the present invention is to provide a method of preparing a heteroepitaxial diamond film on a silicon substrate comprising the steps of (1) depositing a first interfacial layer onto a silicon substrate, where the first interfacial layer consists essentially of a thin layer of cubic boron nitride;

(2) depositing a second interfacial layer onto the first interfacial layer, where the second interfacial layer consists essentially of an ultra-thin layer of carbon with a hydrogen terminated surface; and (3) depositing a heteroepitaxial diamond film on the second interfacial layer. The first interfacial layer is preferably generated by laser ablation with a hexagonal boron nitride target in a nitrogen-containing atmosphere (e.g., nitrogen or nitrogen/argon atmosphere); the second interfacial layer is preferably generated by laser ablation with a carbon target while simultaneously flooding the first interfacial layer with atomic hydrogen; and the heteroepitaxial diamond layer is preferably generated by chemical vapor deposition using a reactive gas mixture containing hydrogen and a carbon-containing gas or gases.

Another object of the present invention is to provide a method of preparing a heteroepitaxial diamond film on a silicon substrate comprising the steps of (1) depositing a first interfacial layer onto a silicon substrate, where the first interfacial layer consists essentially of a thin layer of cubic boron nitride generated by a laser ablation procedure with a hexagonal boron nitride target in a nitrogen-containing atmosphere;

(2) depositing a second interfacial layer onto the first interfacial layer, where the second interfacial layer consists essentially of an ultra-thin layer of hydrogen terminated carbon generated by a laser ablation procedure with a carbon target while simultaneously flooding the first interfacial layer with atomic hydrogen; and (3) depositing a heteroepitaxial diamond film on the second interfacial layer by a microwave chemical vapor deposition procedure using a reactive gas mixture containing hydrogen, oxygen, and a carbon-containing gas or gases.

Still another object of the present invention is to provide a heteroepitaxial diamond coated silicon article comprising in order:

(1) a single crystal silicon substrate;

(2) a first interfacial layer directly on the silicon substrate, wherein the first interfacial layer is cubic boron nitride;

(3) a second interfacial layer directly on the first interfacial layer, wherein the second interfacial layer is laser ablated carbon; and (4) a diamond layer directly on the second interfacial layer, where the diamond layer is epitaxially matched with the silicon substrate.

These and other objects of the present invention will be apparent form a consideration of the following de-

These drawings are intended to illustrate but not to limit the present invention.

DETAILED DESCRIPTION OF THE PREFERRED EMBODIMENTS

Figure 1:
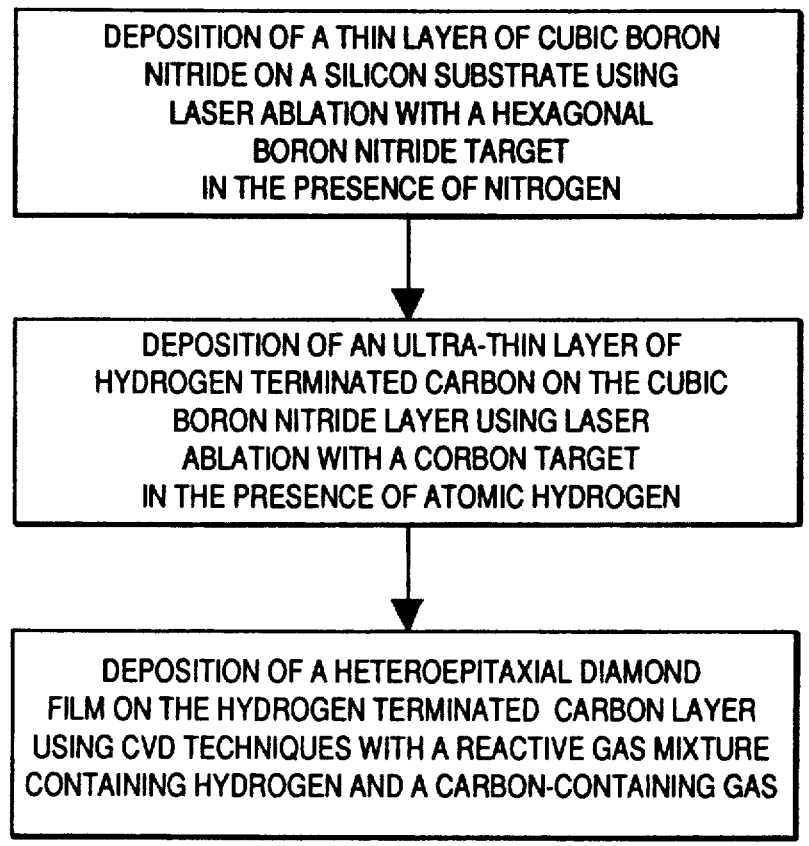
FIG. 1 is a flowchart illustrating the general method of this invention.

This invention relates to a method of preparing heteroepitaxial diamond films on silicon. As illustrated in FIG. 1, this general method first involves the deposition of a thin layer of cubic boron nitride on a silicon substrate using laser ablation with a hexagonal boron nitride target. The cubic boron nitride layer is generally in the range of about 0.3 to $10^5$ nanometers thick and preferably in the range of about 1 to 100 nanometers thick. The cubic boron nitride is formed in the presence of a nitrogen-containing atmosphere (e.g., nitrogen or nitrogen/argon atmosphere), preferably at about 1 to 100 millitorr, most preferably about 50 millitorr. Ionized nitrogen formed during laser ablation should help maintain the stiochiometry of the cubic boron nitride layer. Once the cubic boron nitride layer is formed, a hydrogen terminated carbon layer is deposited on top of the cubic boron nitride. The hydrogen terminated carbon layer is formed by laser ablation using a carbon target in the presence of atomic hydrogen. This hydrogen terminated carbon layer should be ultra-thin, by which is meant that the thickness of the carbon layer is between about 80 percent of monolayer coverage up to about 10 monolayers. For purposes of this invention, "80 percent of monolayer coverage" is defined as coverage of with a single layer of carbon on 80 percent of the surface with the remaining 20 percent of the surface being uncovered (i.e., without a layer of carbon). After the formation o the hydrogen terminated carbon layer, a heteroepitaxial diamond film is deposited using conventional CVD techniques, preferably microwave initiated plasma CVD techniques. The actual thickness of the heteroepitaxial diamond film will depend, in large part, on he desired use of the article prepared. For use in fabricating electronic devices, it will generally be preferred that the diamond layer is from about 1 to 50 microns thick. In some instances, thinner or thicker diamond layers may be preferred.

Figure 2:
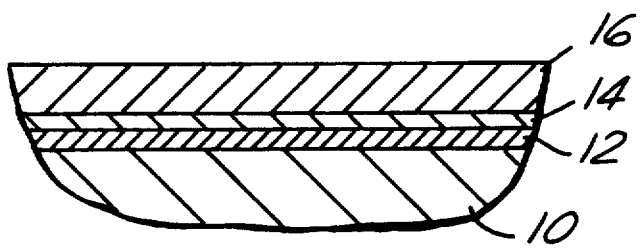
FIG. 2 is a sectional drawing of a silicon substrate with a heteroepitaxial diamond film prepared by the process of this invention.

FIG. 2 illustrates the various layers or components of the articles prepared by the method of the present invention. The silicon substrate 10 is covered by a thin layer 12 of cubic boron nitride. The boron nitride layer 12 is preferably 0.3 to $10^5$ nanometers thick and more preferably 1 to 100 nanometers thick. The cubic boron nitride layer 12 is covered by a ultra-thin layer 14 of carbon. The carbon layer 14 is preferably form about 80 percent of a monolayer up to about 10 monolayers thick and most preferably in the range of about 1 to 2 monolayers. The carbon layer 14 is covered by a heteroepitaxial diamond layer or film 16. Generally, the diamond layer 16 can preferably range from about 1 to 100 microns thick and most preferably from about 1 to 20 microns thick. In some applications, diamond layers 16 thicker or thinner than these ranges may be suitable and preferred.

As noted above, both the cubic boron nitride layer 12 and the carbon layer 14 are deposited, in order, on a suitable silicon substrate using laser ablation techniques. Suitable silicon substrates include single crystal silicon materials, especially those suited for semiconductor applications. Especially preferred are semiconductor-grade silicon substrates with (100), (110), or (111) surfaces. Most preferred are semiconductor-grade silicon substrates with a (100) principal surface. The actual shape of the silicon substrate is not critical. Generally, however, silicon wafers are especially adapted for fabrication of electronic devices and are, therefore, preferred. The principal silicon substrate surface on which the first interfacial layer is to be deposited should be cleaned prior to the deposition process to remove any oxide layer or other contaminants that might be present. Conventional cleaning techniques (e.g., hydrogen fluoride etching) can be used. One especially preferred cleaning technique is plasma etching directly in the laser ablation reacting chamber suing atomic hydrogen to remove any residual surface oxide layer. Such a cleaning technique employs the same atomic hydrogen injectors (38 in FIG. 3) as used during the deposition of the second interfacial layer. By cleaning the silicon surface directly within the laser ablation reaction chamber (20 in FIG. 3), the possibility of contamination during transfer to the laser ablation apparatus is eliminated.

Figure 3:
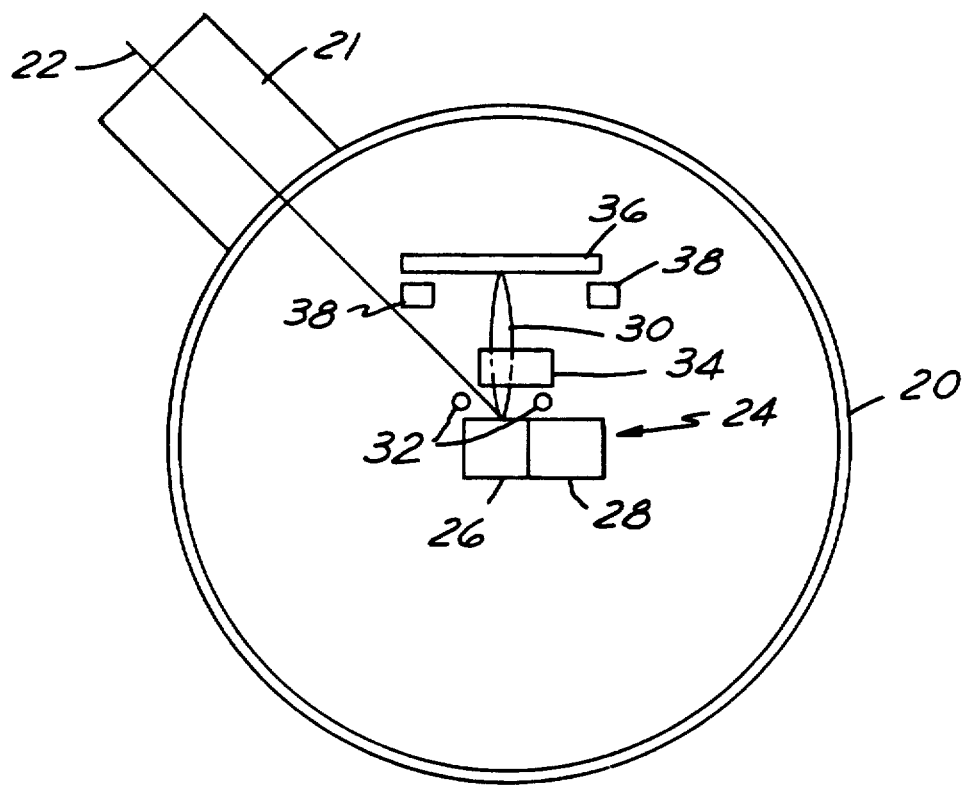
FIG. 3 is a schematic drawing of a laser ablation system suitable for preparing the intermediate cubic boron nitride and carbon layers required in the present invention.

Conventional laser ablation systems can be employed to deposit, in order, the first and second interfacial layers of cubic boron nitride and hydrogen terminated carbon, respectively. On such suitable laser ablation system is described in Doll et al., 191 *Mat. Res. Soc. Symp. Proc.* 55 (1990), which is hereby incorporated by reference. Doll et al. used a KrF laser operating at 248 nm. Other laser systems and laser ablation systems can be used so long as a suitable cubic boron nitride layer can be deposited on the silicon substrate. A preferred laser ablation system is shown in FIG. 3. This preferred system includes a reaction chamber 20 into which a pulsed excimer laser beam 22 can be introduced through the laser entry port 21. Upon entering the reaction chamber 20, the excimer laser beam 22 (focused with appropriate lenses which are not shown) impinges upon the rotating ablation target 24. The target 24 illustrated in FIG. 2 is shaped like a hockey puck and is orientated such that laser beam 22 impacts its flat surface; other shapes can, of course, be sued if desired. As shown in FIG. 3, this target 24 consists of two halves: one half of the target is hexagonal boron nitride 26 and the other half is carbon 28. The target 24 is connected to a motor or other device (not shown) whereby the target can be rotating. By adjusting the speed of rotation and pulse rate of the excimer laser beam 22, the portion of the target 24 that the beam 22 strikes can be controlled. During deposition of the first interfacial layer, the rotation and pulse rates should be controlled so that only the hexagonal boron nitride portion 256 of the target 24 is struck by the laser beam 22. And during the deposition of the second interfacial layer, the rotation and pulse rates should be controlled so that only the carbon portion 28 of the target 24 is struck by the laser beam 22.

As one skilled in the art will realize, other target configurations could be used. For example, two separate targets (one hexagonal boron nitride and the other carbon), which can be moved into the laser beam 22 as needed or onto which the laser beam can be focused upon as needed, could be used. Or the target 22 could consist of an outer core of one of the target materials and an inner core of the other target material. By focusing the laser beam 22 on the appropriate area of the target, each interfacial area could be deposited as required. In any event, it is preferred that the target is rotated during the deposition process to avoid excessive pitting of the target in any one area.

As the pulsed excimer laser beam 22 impinges upon the appropriate area of the rotating target 22, a plume 30 of the target material will be formed. When the laser beam 22 strikes the boron nitride portion 26 of the target, the plume will consist of boron nitride-related species. When, on the other hand, the laser beam 22 strikes the carbon portion 28 of the target, the plume will consist of carbon-related species. The plume 30 then travels to the heated substrate 36 where the appropriate interfacial layers will be deposited. The temperature of the heated substrate 36 should be at least 300° C. and preferably at least 400° C. It is most preferred that the temperature of the substrate is in the range of 400° to 500° C. during deposition of the cubic boron nitride layer.

The deposition of the first interfacial layer (i.e., cubic boron nitride), as noted above, should take place in the presence of nitrogen. Ionized nitrogen formed during laser ablation should help maintain the stoichiometry of the cubic boron nitride layer. The deposition of the second interfacial layer (i.e., carbon) should take place as the heated substrate 36 is flooded with atomic hydrogen from the atomic hydrogen injectors 38 located adjacent to the heated substrate. The temperature of the heated substrate 36 should be at least 300° C. and preferably at least 400° C. It is most preferred that the temperature of the substrate is in the range of 400° to 500° C. during deposition of the hydrogen terminated carbon layer. Some nitrogen from the previous step (i.e., deposition of the first interfacial layer) can be present during this carbon deposition step but is not necessary. In other words, it is not necessary to remove all the $N_2$ from the boron nitride deposition step before beginning the carbon deposition step. It is preferred, however, that the nitrogen atmosphere is removed prior to ablation of the carbon target.

The atomic hydrogen present during the deposition of the second interfacial layer helps to insure that the carbon layer is hydrogen terminated. This hydrogen terminated carbon surface has significant $sp^3$ character and significant concentration of C—H bonds on the surface with the hydrogen atoms extending up from the surface. Although not wishing to be limited by theory, it is thought that such C—H bonds with predominate $sp^3$ character provide nucleation sites for subsequent heteroepitaxial diamond growth during the CVD deposition phase of this process. A carbon surface prepared without atomic hydrogen is through to have "flattened" C—C bonds on the surface which are not expected to provide especially suitable or sufficient nucleation sites for CVD diamond deposition. The extend or degree of hydrogenation of the carbon surface is not critical so long as there are sufficient nucleation sites for diamond growth during the CVD process.

The atomic hydrogen used during the deposition of the second interfacial layer can be generated by techniques well known in the art. For example, plasma discharge can be used to generate the atomic hydrogen.

Although not required, it is generally preferred that the laser ablation system employ bias rings 32 and a magnetic plasma intensifier and particle sorter 34 as shown in FIG. 3 during the deposition of either the first or second interfacial layer. The use of the bias rings 32 and particle intensifier and sorter 34 is especially helpful during the laser ablation of the hexagonal boron nitride target. The bias rings 32 and particle intensifier and sorter 34 supply additional energy to the ablation plume and, therefore, more efficiently ionize the local nitrogen gas and reduce contamination of the cubic boron nitride layer formed on the substate. The increased energy of the plume is expected to increase surface mobility and, thus, provide for improved cubic boron nitride deposition and surface characteristics. And, as noted above, increased nitrogen ionization should reduce nitrogen deficiency in the cubic boron nitride layer. The bias rings 32 and magnetic plasma intensifier and particle sorter 34 can also be used during the deposition of the second interfacial layer consisting of hydrogen terminated carbon although the effects are not as pronounced.

The bias ring 32 is inserted between the target 24 and the substrate 36 so that the plume passes through the bias ring 32 as shown in FIG. 3. If desired, more than one bias ring can be used. The bias ring 32 can be fabricated from a refractory material such as molybdenum, tungsten, and the like and is isolated from ground with an insulator (not shown) such as a quartz tube. The bias ring 32 can be elevated to a satisfactory potential of a few hundred volts. As noted above, the primary purpose of the bias ring 32 is to supply additional energy to the ablation plume and, therefore, more efficiently ionize the local nitrogen gas and reduce contamination of the cubic boron nitride layer formed on the substrate. The magnetic plasma intensifier and particle sorter 34 applies a strong magnetic filed across the plume 30 and thereby diverts charged particles contained in the plume 30 from the main path of the plume and away from the substrate 36. The diverted charged particles can be impacted and absorbed by an appropriately grounded stop or member (not shown). Removal of charged particles from the plume 30 before it strikes the substrate 36 provides for better deposition of the cubic boron nitride and/or hydrogen terminated carbon layers and reduces film charging.

Once the cubic boron nitride and the hydrogen terminated carbon layers have been formed, a heteroepitaxial diamond film is grown directly on the hydrogen terminated carbon layer using conventional CVD techniques and equipment. Such CVD methods and systems include, for example, those described in U.S. Pat. No. 5,130,111 and copening U.S. patent application Ser. No. 07/550,273 filed Jul. 9, 1990 and entitled "Radiation Resistant Polycrystalline Diamond Optical an Thermally Conductive Articles and Their Method of Manufacture," all of which are hereby incorporated by reference. The hydrogen terminated carbon layer appears to both passivate the underlying cubic boron nitride layer by preventing the boron nitride from being volatilized or destroyed by reaction with reactive carbon species during the CVD process and by acting as a diamond nucleation precursor surface during the CVD process. Numerous chemical vapor deposition techniques are suitable for use in the present invention. Generally, however, the plasma CVD methods are preferred with microwave plasma deposition being most preferred. Microwave plasma deposition is preferred due in large part to its reliability and consistency in forming high-purity and high-quality diamond deposits.

The silicon substrate with both the first interfacial layer of cubic boron nitride and the second interfacial layer of hydrogen terminated carbon can be place din a conventional microwave plasma deposition chamber on a support or susceptor which can be heated by induction heating or the like. If desired, the ablation system illustrated in FIG. 3 could be modified so that the CVD process could be carried out in that same system, thereby minimizing the possibility of contamination during transfer. The doubly coated substrate is then heated to a temperature of about 500° to 1100° C., a range selected to promote vapor phase diamond nucleation and growth. The feedstock gases which are used to create the vapor include hydrogen and a carbon-containing gas such as methane, ethane, acetylene, methanol, ethanol, carbon dioxide, carbon monoxide, and the like. Mixtures of such carbon-containing gases may also be used. One preferred feedstock gas mixture contains methane and hydrogen. When the preferred microwave plasma CVD method is employed, it is preferred that the feedstock gas mixture comprise from about 90 to 99 volume percent hydrogen and from about 1 to 10 volume percent methane with the mixture comprising about 99 volume percent hydrogen and about 1 volume percent methane being especially preferred. The feedstock gas can, and preferably does, contain oxygen in addition to hydrogen and the carbon-containing gas. Feedstock gases without oxygen generally optimize nucleation of the hydrogen terminated carbon surface. While those contain oxygen generally provide better bulk diamond growth. A feedstock gas mixture containing about 89 to 98.9 volume percent hydrogen, about 1 to 10 volume percent methane, and about 0.1 to 10 volume percent oxygen provides good bulk diamond growth. In the practice of this present invention, the CVD process could being with a feedstock gas without oxygen for nucleation and then switch to a feedstock gas with oxygen for bulk diamond growth. Or the CVD process could proceed with either type of feedstock gas mixture alone. Generally, CVD processes involving oxygen-containing feedstock mixtures are preferred in the present invention. A wide range of gas pressures can be used, ranging from a fraction of a torr up to several hundred torr; generally, pressures in the range of about 20 to 60 torr are preferred. The flow of feedstock gases will typically be in the range of about 100 to 1000 SCCM, depending on the desired deposition rate and the size of the deposition reactor. As one skilled in the art realizes, other gas mixture concentrations and/or other gases or gas mixtures and/or other pressures ranges may also be suitable.

With microwave plasma deposition, a range of operating frequencies can be used although a frequency of about 2.45 GHz is most commonly used. Power levels of a few hundred watts up to about five kilowatts or greater are generally satisfactory; a power level of about 1.5 kilowatts will be suitable for many purposes. Generally, as the power level increase, the deposition rate will increase. At the highest deposition rates, however, the quality of the deposited heteroepitaxial diamond film may suffer. Furthermore, slower depositions rates will generally improve, and allow improved control over, crystal morphology. Thus, the especially where the heteroepitaxial diamond film over silicon material will be used to fabricate electronic devices, slower deposition rates will be preferred.

After the desired thickness of heteroepitaxial diamond film has been deposited, the silicon material coated with heteroepitaxial diamond film can be removed from the CVD chamber. As noted above, the thickness of the heteroepitaxial diamond film will generally be in the range of about 1 to 100 microns. Thinner or thicker heteroepitaxial diamond films can also be prepared and, for some application, may be preferred. Generally the heteroepitaxial diamond films prepared on silicon substrates, especially on silicon wafers, can be used to prepare electronic and semiconductor devices. The products of the present invention should be especially useful in the fabrication of high-speed, high-power semiconductor devices or integrated circuits. Examples of semiconductor devices which could be fabricated from materials prepared from the process of this invention include power FETs, switching transistors, microwave transistors, and the like. Such materials could also be sued to develop upside-down, diamond cooled, silicon circuitry and technology where the thermal properties of diamond are used to manage the heat generated in the circuitry. As one skilled in the art will realize, the heteroepitaxial diamond film of the present invention may allow the development of new and novel electronic devices with improved operating and electronic characteristics.

The following example is intended to further illustrate the invention and not to limit is.

EXAMPLE

A suitably cleaned silicon substrate (i.e., a silicon wafer) would be placed inside the chamber of a laser ablation apparatus containing a rotating target consisting of one-half portion of hexagonal boron nitride and one-half portion of carbon (see FIG. 3). The target would be heated to 450° C. A pulsed excimer KrF laser operating at 248 nm with $MgF_2$ lenses would be focused on the target. By adjusting the laser pulse rate and the target rotation rate, the laser would strike only the hexagonal boron nitride portion of the target. Purified nitrogen and argon gases (about 1 to 4 volume ratio) would be metered into the reaction chamber at about 15 SCCM during ablation of the hexagonal boron nitride. Ablation of the hexagonal boron nitride would continue until a cubic boron nitride layer of about 10 nanometers thickness is formed on the heated substrate.

After the cubic boron nitride layer is deposited, the laser pulse rate and the target rotation rate would be readjusted so that only the carbon half of the target will be ablated. After terminating the nitrogen/argon flow and initiating the atomic hydrogen generation, the ablation of carbon would begin. The atomic hydrogen injectors would be arranged so that atomic hydrogen would flood the cubic boron nitride surface as the carbon ablation continues. Ablation of the carbon would continue until a hydrogen terminated carbon layer of about one monolayer thickness is formed on the cubic boron nitride layer on the heated substrate.

The silicon substrate with the cubic boron nitride and hydrogen terminated carbon layers would be transferred to the chamber of a microwave plasma deposition apparatus in a manner to avoid contamination. Feedstock gases comprising about 99 volume percent hydrogen and about 1 volume percent methane would be metered into the reaction chamber at about 999 SCCM and about 10 SCCM, respectively. The coated silicon substrate would be inductively heated to 900° C. A gas plasma would then be formed by microwave radiation at 2.45 GHz and 1.5 kilowatt. The microwave energy would dissociate the gas mixture to form a gas plasma containing reactive carbon species. The gas plasma impinging upon the hydrogen terminated carbon layer of the silicon substrate would result in heteroepitaxial diamond growth. The process would continue for approximately eight hours at which time a heteroepitaxial diamond layer of about 4 microns would be formed on the carbon layer. The gas flow and microwave radiation would be turned off and the resulting article would be allowed to cool to room temperature. The silicon substrate with a heteroepitaxial diamond film would then be removed from the reaction chamber.

That which is claimed is:

1. A method of preparing a heteroepitaxial diamond film on a silicon substrate comprising the steps of
   (1) depositing a first interfacial layer onto a silicon substrate, where the first interfacial layer consists essentially of a thin layer of cubic boron nitride;
   (2) depositing a second interfacial layer onto the first interfacial layer, where the second interfacial layer consists essentially of an ultra-thin layer of carbon with a hydrogen terminated surface; and
   (3) depositing a heteroepitaxial diamond film on the second interfacial layer.

2. A method as defined in claim 1, wherein the first interfacial layer is generated by laser ablation with a hexagonal boron nitride target in a nitrogen-containing atmosphere; wherein the second interfacial layer is generated by laser ablation with a carbon target while simultaneously flooding the first interfacial layer with atomic hydrogen; and wherein the heteroepitaxial diamond layer is generated by chemical vapor deposition using a reactive gas mixture containing hydrogen and a carbon-containing gas or gases.

3. A method as defined in claim 2, wherein the silicon substrate is (100) silicon, (110) silicon, or (111) silicon.

4. A method as defined in claim 2, wherein the silicon substrate is (100) silicon.

5. A method as defined in claim 3, wherein the silicon substrate is a silicon wafer.

6. A method as defined in claim 3, wherein the first interfacial layer is about 0.3 to $10^5$ nanometers thick.

7. A method as defined in claim 6, wherein the first interfacial layer is about 1 to 100 nanometers thick.

8. A method as defined in claim 6, wherein the second interfacial layer has a thickness from about 80 percent of a monolayer to about 10 monolayers.

9. A method as defined in claim 8, wherein the second interfacial layer has a thickness from about 1 to 2 monolayers.

10. A method as defined in claim 10, wherein the heteroepitaxial diamond layer is about 1 to 100 microns thick.

11. A method as defined in claim 10, wherein the heteroepitaxial diamond layer is about 1 to 20 microns thick.

12. A method as defined in claim 3, wherein the carbon-containing gas is selected from the group consisting of methane, ethane, acetylene, methanol, ethanol, carbon dioxide, and carbon monoxide and wherein the chemical vapor deposition is microwave initiated plasma chemical vapor deposition.

13. A method as defined in claim 3, wherein the reactive gas mixture contains about 89 to 99 volume percent hydrogen, about 1 to 10 volume percent methane, and 0 to about 10 volume percent oxygen.

14. A method as defined in claim 2, wherein the first interfacial layer is generated by laser ablation using a bias ring and a magnetic plasma intensifier and particle sorter to provide increase energy to the plasma whereby the concentration of ionized nitrogen reaching the surface of the silicon substrate increases.

15. A method as defined in claim 2, wherein the laser ablation procedure used to deposit both the first and second interfacial layers uses a pulsed excimer laser and a single rotating target comprising separate sections of hexagonal boron nitride and carbon.

16. A method of preparing a heteroepitaxial diamond film on a silicon substrate comprising the steps of
   (1) depositing a first interfacial layer onto a silicon substrate, where the first interfacial layer consists essentially of a thin layer of cubic boron nitride generated by a laser ablation procedure with a hexagonal boron nitride target in a nitrogen-containing atmosphere;
   (2) depositing a second interfacial layer onto the first interfacial layer, where the second interfacial layer consists essentially of an ultra-thin layer of hydrogen terminated carbon generated by a laser ablation procedure with a carbon target while simultaneously flooding the first interfacial layer with atomic hydrogen; and
   (3) depositing a heteroepitaxial diamond film on the second interfacial layer by a microwave chemical vapor deposition procedure using a reactive gas mixture containing hydrogen, oxygen, and a carbon-containing gas or gases.

17. A method as defined in claim 16, wherein the silicon substrate is (100) silicon, (110) silicon, or (111) silicon.

18. A method as defined in claim 16, wherein the silicon substrate is (100) silicon.

19. A method as defined in claim 17, wherein the silicon substrate is a silicon wafer.

20. A method as defined in claim 17, wherein the first interfacial layer is about 0.3 to $10^5$ nanometers thick.

21. A method as defined in claim 20, wherein the first interfacial layer is about 1 to 100 nanometers thick.

22. A method as defined in claim 20, wherein the second interfacial layer has a thickness from about 80 percent of a monolayer to about 10 monolayers.

23. A method as defined in claim 22, wherein the second interfacial layer has a thickness from about 1 to 2monolayers.

24. A method as defined in claim 22, wherein the heteroepitaxial diamond layer is about 1 to 100 microns thick.

25. A method as defined in claim 24, wherein the heteroepitaxial diamond layer is about 1 to 20 microns thick.

26. A method as defined in claim 17, wherein the carbon-containing gas is selected from the group consisting of methane, ethane, acetylene, methanol, ethanol, carbon dioxide, and carbon monoxide.

27. A method as defined in claim 17, wherein the reactive gas mixture contains about 89 to 99 volume percent hydrogen, about 1 to 10 volume percent methane, and 0 to about 10 volume percent oxygen.

28. A method as defined in claim 16, wherein the first interfacial layer is generated by laser ablation using a bias ring and a magnetic plasma intensifier and particle sorter to provide increase energy to the plasma whereby the concentration of ionized nitrogen reaching the surface of the silicon substrate increases.

29. A method as defined in claim 16, wherein the laser ablation procedure used to deposit both the first and second interfacial layers uses a pulsed excimer laser and a single rotating target comprising both the hexagonal boron nitride target and carbon target as separate portions.

* * * * *

UNITED STATES PATENT AND TRADEMARK OFFICE
CERTIFICATE OF CORRECTION

PATENT NO. : 5,236,545

DATED : August 17, 1993

INVENTOR(S) : Pryor

It is certified that error appears in the above-identified patent and that said Letters Patent is hereby corrected as shown below:

Column 11, line 50, the second "10" should read "8".

Column 12, line 42, there should be a space between "2" and "monolayers".

Signed and Sealed this

Eighth Day of March, 1994

Attest:

BRUCE LEHMAN

Attesting Officer     Commissioner of Patents and Trademarks